(12) United States Patent
Na et al.

(10) Patent No.: US 8,618,972 B1
(45) Date of Patent: Dec. 31, 2013

(54) ANALOG-TO-DIGITAL SIGNAL CONVERSION METHOD AND APPARATUS THEREFOR

(75) Inventors: Yoo Sam Na, Gyunggi-do (KR); Kang Yoon Lee, Seoul (KR); Young Gun Pu, Jeju-do (KR); Hyung Gu Park, Seoul (KR); Hong Jin Kim, Seoul (KR); Yoo Hwan Kim, Gyunggi-do (KR); Dong Su Lee, Gyunggi-do (KR)

(73) Assignees: Samsung Electro-Mechanics Co., Ltd., Gyunggi-Do (KR); Research & Business Foundation Sungkyunkwan University, Gyunggi-Do (KR)

( * ) Notice: Subject to any disclaimer, the term of this patent is extended or adjusted under 35 U.S.C. 154(b) by 0 days.

(21) Appl. No.: 13/620,352

(22) Filed: Sep. 14, 2012

(30) Foreign Application Priority Data

Jul. 4, 2012 (KR) .................. 10-2012-0073053

(51) Int. Cl.
 *H03M 1/12* (2006.01)
(52) U.S. Cl.
 USPC .......................... 341/155; 341/157; 341/166
(58) Field of Classification Search
 USPC .................................................. 341/155, 166
 See application file for complete search history.

(56) References Cited

U.S. PATENT DOCUMENTS

| 7,791,525 | B2 * | 9/2010 | Rivoir | 341/166 |
|---|---|---|---|---|
| 7,804,290 | B2 * | 9/2010 | Henzler et al. | 324/76.82 |
| 8,064,561 | B2 * | 11/2011 | Henzler | 375/371 |
| 8,138,958 | B2 * | 3/2012 | Dai et al. | 341/155 |
| 2009/0153377 | A1 | 6/2009 | Chang | |

FOREIGN PATENT DOCUMENTS

| JP | 2008-312185 A | 12/2008 |
|---|---|---|
| KR | 1020110025680 A | 3/2011 |
| KR | 2011-0113790 A | 10/2011 |
| KR | 1020110138515 A | 12/2011 |

OTHER PUBLICATIONS

Korean Office Action issued in Application No. 10-2012-0073053 dated Aug. 26, 2013.

\* cited by examiner

*Primary Examiner* — Khai M Nguyen
(74) *Attorney, Agent, or Firm* — McDermott Will & Emery LLP

(57) ABSTRACT

There are provided an analog-to-digital signal conversion method and apparatus therefor, and a digital phase locked loop circuit including the same. The analog-to-digital signal conversion method may include: generating a first digital output signal having N number of bits by comparing each of N number of delay signals detected from output terminals of N number of delay cells with a reference signal; generating a second digital output signal by comparing an auxiliary delay signal generated by an (N+1)th delay cell with the reference signal; and determining a change in a delay time of each of the N number of delay cells based on the first digital output signal and the second digital output signal.

18 Claims, 9 Drawing Sheets

ANALOG-TO-DIGITAL SIGNAL CONVERSION METHOD AND APPARATUS THEREFOR

CROSS-REFERENCE TO RELATED APPLICATIONS

This application claims the priority of Korean Patent Application No. 10-2012-0073053 filed on Jul. 4, 2012, in the Korean Intellectual Property Office, the disclosure of which is incorporated herein by reference.

BACKGROUND OF THE INVENTION

1. Field of the Invention

The present invention relates to an analog-to-digital signal conversion method and apparatus therefor, and a digital phase locked loop circuit including the same.

2. Description of the Related Art

A phase locked loop (PLL) circuit is widely used to generate an application carrier frequency in a $4^{th}$-generation mobile communications system such as long term evolution (LTE), or the like, a cellular phone technology such as Bluetooth™, a global positioning system (GPS), a wideband code division multiple access (WCDMA) scheme, or the like, a wireless local area network (WLAN) such as an 802.11a/b/g scheme, or the like. A related art analog PLL circuit has a problem in that it requires a divider operable at high speed, and since a width-length ratio of a metal-oxide semiconductor (MOS) may be limited depending on noise, accuracy, or the like, of a current source, the area thereof cannot be reduced.

Also, since a loop filter includes a passive resistor and a capacitor, it takes up a relatively large area, and in order to secure a desired analog signal level, a voltage-controller oscillator (VCO) buffer, a local oscillator (LO) buffer, an output buffer, or the like, is required in order to increase power consumption. In addition, when a process is changed, all the blocks are required to be substantially re-designed due to the sensitivity to process characteristics of the analog PLL circuit, increasing a fabrication time and manufacturing costs. Thus, demand for a digital PLL circuit in which the foregoing problems are able to solved has been ongoing.

A digital PLL circuit is a block for converting an analog signal into a digital signal, which may include a time-to-digital converter (TDC). The TDC includes one or more delay cells, and a delay time of each delay cell may be increased or decreased according to a process, a supply voltage, a temperature, and the like, such as PVT (Process, Voltage, and Temperature) conditions. Thus, a technique for effectively compensating for a change in a delay time according to the PVT conditions, or the like, is required in the design stage of a TDC.

Patent Document 1 relates to a TDC and proposes a TDC as an analog-to-digital converter applicable to a digital PLL circuit, but without the disclosure of content regarding an auxiliary delay cell and content of compensating for a change in a delay time of each delay cell. Also, Patent Document 2 discloses content of outputting two digital signals from different TDCs, but without content of compensating for a change in a delay time by using the two digital signals.

RELATED ART DOCUMENT (Patent Document 1) 1. Korean Patent Laid Open Publication No. KR 10-2011-0113790

(Patent Document 2) 2. US Patent Laid Open Publication No. US 2009/0153377

SUMMARY OF THE INVENTION

An aspect of the present invention provides an analog-to-digital signal conversion method and apparatus therefor and a digital phase locked loop (PLL) circuit including the same, capable of compensating for a change in a delay time generated according to PVT conditions by using digital signals generated from N number of delay cells and an auxiliary delay cell, by additionally connecting the auxiliary delay cell to the N number of delay cells.

According to an aspect of the present invention, there is provided an analog-to-digital signal conversion method including: generating a first digital output signal having N number of bits by comparing each of N number of delay signals detected from output terminals of N number of delay cells with a reference signal; generating a second digital output signal by comparing an auxiliary delay signal generated by an (N+1)th delay cell with the reference signal; and determining a change in a delay time of each of the N number of delay cells based on the first digital output signal and the second digital output signal.

In the determining, when the second digital output signal has a high value, it may be determined that the delay time of each of the N number of delay cells has decreased.

In the determining, when the second digital output signal has a low value, it may be determined that the delay time of each of the N number of delay cells has increased or is normal.

In the determining, when the number of bits having a value of "1" among the N number of bits in the first digital output signal is smaller than the number of bits having a high value in the first digital output signal when the delay time of each of the N number of delay cells is normal, it may be determined that the delay time of each of the N number of delay cells has increased.

The method may further include: correcting the delay time of each of the N number of delay cells, when it is determined that the delay time of each of the N number of delay cells has changed in the determining of a change in a delay time.

In the correcting, when it is determined that the delay time of each of the N number of delay cells has increased, a capacitance value of a capacitor bank included in each of the N number of delay cells may be reduced.

In the correcting, when it is determined that the delay time of each of the N number of delay cells has decreased, a capacitance value of a capacitor bank included in each of the N number of delay cells may be increased.

According to another aspect of the present invention, there is provided an analog-to-digital signal conversion apparatus including: a signal conversion unit including N number of delay cells connected to each other in series and generating N number of delay signals from a predetermined input signal and an auxiliary delay cell connected in series to an Nth delay cell among the N number of delay cells; and a signal processing unit generating a first digital output signal having N number of bits by comparing each of the N number of delay signals with a reference signal, and generating a second digital output signal by comparing an auxiliary delay signal output by the auxiliary delay cell with the reference signal, wherein the signal processing unit determines a change in a delay time of each of the N number of delay cells based on the first digital output signal and the second digital output signal.

Each of the N number of delay cells may include a capacitor bank having a variable capacitance value determined by a digital control signal having M number of bits.

When it is determined that the delay time of each of the N number of delay cells is outside of a normal range, the signal processing unit may adjust the delay time of each of the N number of delay cells by adjusting the variable capacitance value of the capacitor bank.

When it is determined that the delay time of each of the N number of delay cells is greater than an upper limit value of the normal range, the signal processing unit may reduce the variable capacitance value of the capacitor bank.

When it is determined that the delay time of each of the N number of delay cells is smaller than a lower limit value of the normal range, the signal processing unit may increase the variable capacitance value of the capacitor bank.

The capacitor bank may include: a fixed capacitor having a fixed capacitance value smaller than a maximum value of the variable capacitance value; and M number of capacitor units selectively controlled by a value of each of the M number of bits included in the digital control signal.

A capacitor unit among the m number of capacitor units, controlled by a most significant bit (MSB) value among the M number of bits, may have a capacitance value corresponding to 30% of a maximum value of the variable capacitance value, and a capacitor unit among the m number of capacitor units, controlled by a least significant bit (LSB) value among the M number of bits, may have a capacitance value corresponding to $30/2^M$% of the maximum value of the variable capacitance value.

When the second digital output signal has a high value, the signal processing unit may determine that the delay time of each of the N number of delay cells has decreased.

When the second digital output signal has a low value and the number of bits having a high value in the first digital output signal is smaller than the number of bits having a high value included in the first digital output signal when the delay time of each of the N number of delay cells is normal, the signal processing unit may determine that the delay time of each of the N number of delay cells has increased.

The input signal may include a first input signal generated by the signal processing unit and used to determine the change in the delay time of each of the N number of delay cells and a second input signal transferred from the outside, and the reference signal may include a first reference signal generated by the signal processing unit and used to determine the change in the delay time of each of the N number of delay cells and a second reference signal transferred from the outside.

The apparatus may further include: a signal selection unit controlling the first input signal and the first reference signal to be input to the signal conversion unit when an input selection signal output by the signal processing unit has a first value, and controlling the second input signal and the second reference signal to be input to the signal conversion unit when the input selection signal has a second value different from the first value.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
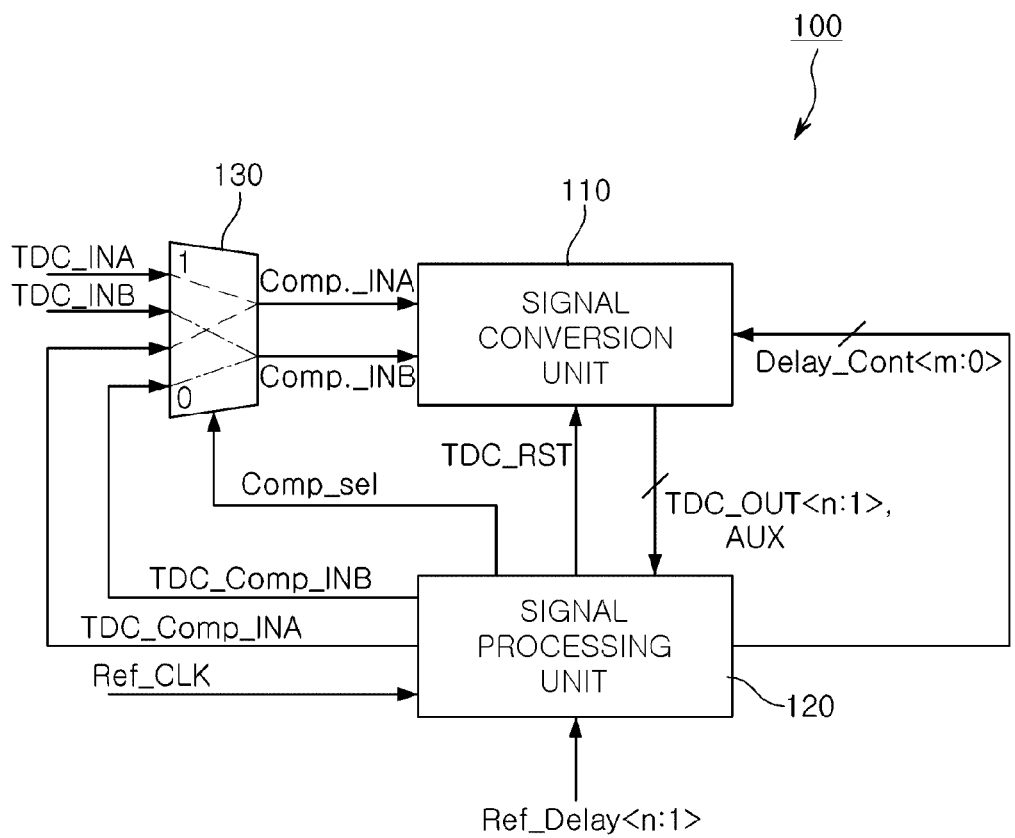
FIG. 1 is a block diagram of an analog-to-digital signal conversion apparatus according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

FIG. 1 is a block diagram of an analog-to-digital signal conversion apparatus according to an embodiment of the present invention.

Referring to FIG. 1, an analog-to-digital signal conversion apparatus 100 according to an embodiment of the present invention includes a signal conversion unit 110, a signal processing unit 120, and a signal selection unit 130. The signal conversion unit 110 generates digital output signals by using input signals TDC_INA and TDC_INB transferred from a digital phase locked loop (PLL) circuit. The digital output signals may include a first digital output signal TDC_OUT<n:1> and a second digital output signal AUX. As noted from the symbols, the first digital output signal TDC_OUT<n:1> may be a digital signal having N number of bits (N is a positive integer of 1 or greater).

The signal processing unit 120 generates an output signal Delay_Cont<m:0> based on a reference clock signal Ref_CLK, an input signal Ref_Delay<n:1>, and the output signals TDC_OUT<n:1> and AUX from the signal conversion unit 110. The output signal Delay_Cont<m:0> from the signal processing unit 120 may be a digital signal having M number of bits and may be used to adjust a delay time of each of N number of delay cells included in the signal conversion unit 110.

The signal selection unit 103 may be implemented as a multiplexer and select one of a first input signal pair, that is, the input signals TDC_INA and TDC_INB transferred from the digital PLL circuit according to a control signal Comp_sel generated by the signal processing unit 120 and a second input signal pair TDC_Comp_INA and TDC_Comp_INB generated by the signal processing unit 120. For example, in a normal operational state, the first input signal pair TDC_INA and TDC_INB may be selected by the signal selection unit 130 and input to the signal conversion unit 110. Also, in a correction operational state for correcting a delay time of each of a plurality of delay cells included in the signal conversion unit 110, the second input signal pair TDC_Comp_INA and TDC_Comp_INB may be selected and input to the signal conversion unit 110.

Figure 2:
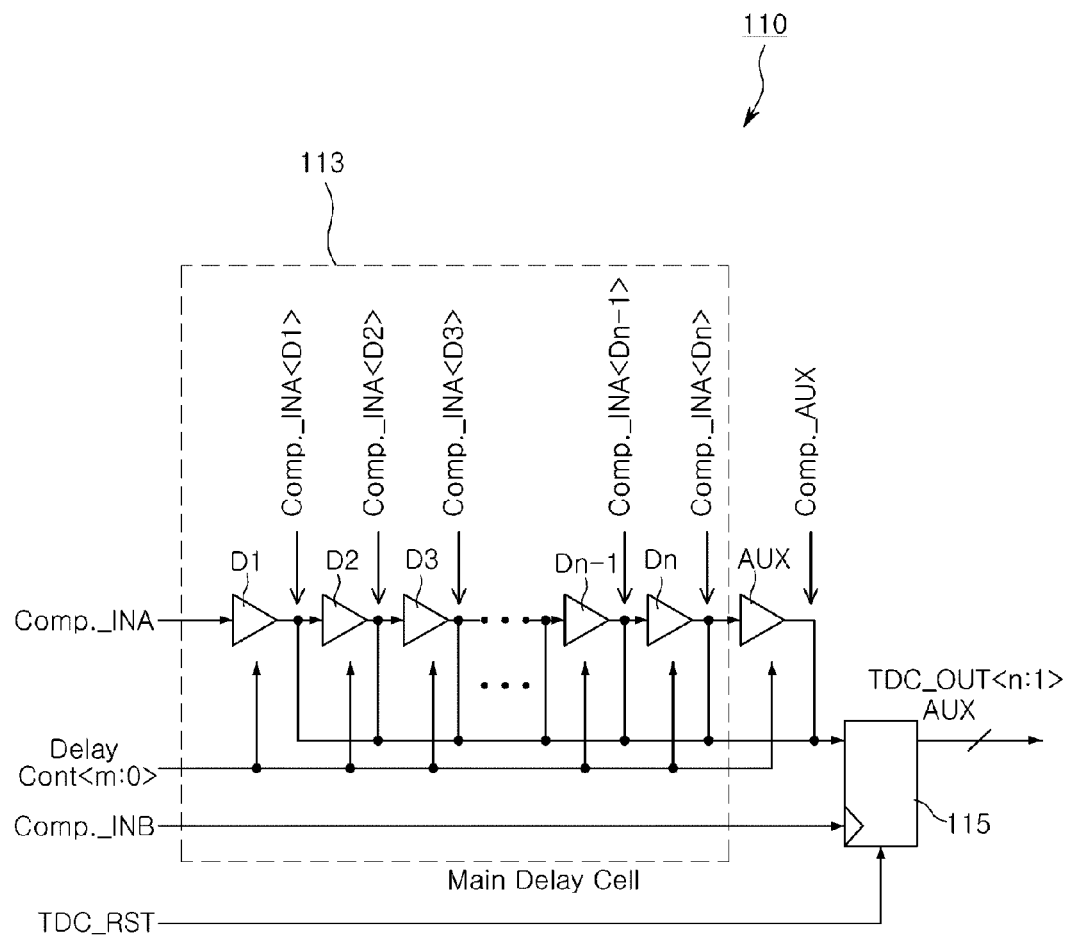
FIG. 2 is a detailed view of a signal conversion unit of the analog-to-digital signal conversion apparatus illustrated in FIG. 1.

FIG. 2 is a detailed view of the signal conversion unit of the analog-to-digital signal conversion apparatus illustrated in FIG. 1.

Referring to FIG. 2, the signal conversion unit 110 according to the embodiment of the present invention may include N number of delay cells D1~Dn 113 connected to each other in series, and an auxiliary delay cell D_AUX connected to an output terminal of the Nth delay cell Dn in series in serial connection order. TDC_INA or TDC_Comp_INA may input to an input terminal of the first delay cell D1 according to an operation of the signal selection unit 130. Hereinafter, for the purposes of description, a signal selected by the signal selection unit 130 and applied to the input terminal of the first delay cell D1 will be defined as Comp_INA.

The N number of delay cells D1~Dn included in the signal conversion unit 110 and the auxiliary delay cell D_AUX have particular respective delay times. Thus, when an ideal delay time of the respective N number of delay cells D1~Dn and the auxiliary delay cell D_AUX is defined as Tres, a signal Comp_INA<D1> detected from an output terminal of the first delay cell D1 may be a signal which has been delayed by the delay time Tres in comparison to the input signal Comp_INA. When calculated in this manner, a signal Comp_INA<Dn> obtained by delaying the input signal Comp_INA by N*the delay time Tres may be detected from an output terminal of the Nth delay cell Dn. Meanwhile, a signal Comp_AUX may be detected from an output terminal of the auxiliary delay cell D_AUX, and in the case that the delay time of the auxiliary delay cell D_AUX is equal to the delay time of each of the N number of delay cells D1~Dn, the Comp_AUX may be considered as a signal obtained by delaying the input signal Comp_INA by (N+1)*the delay time Tres.

The delay time Tres of each of the delay cells D1~Dn is controlled by a delay time control signal, the digital signal Delay_Cont<m: 0> (hereinafter, referred to as a "control signal Delay_Cont<m:0>". Namely, the control signal Delay_Cont<m: 0> having M number of bits is input to one of the delay cells D1~Dn and used to control a delay time thereof. A method of adjusting a delay time of each of the delay cells D1~Dn by the digital control signal Delay_Cont<m: 0> will be described with reference to FIGS. 7 and 8 later.

Meanwhile, the other input signal TDC_INB or TDC_Comp_INB selected by the signal selection unit 130 may correspond to an input signal Comp_INB illustrated in FIG. 2. The input signal Comp_INB may be directly input to a flip-flop 115, rather than the delay cells D1~Dn. The flip-flop 115 compares N number of digital delay signals sequentially delayed in the respective delay cells D1~Dn and the output signal Comp_AUX from the auxiliary delay cell C_AUX with the input signal Comp_INB to generate output signals. The output signals of the flipflop 115 may be the first digital output signal TDC_OUT<n:1> having N number of bits and the second digital output signal AUX having one bit. As described above with reference to FIG. 1, the first digital output signal TDC_OUT<n:1> and the second digital output signal AUX are transferred to the signal processing unit 120 to detect a change in a delay time of each of the delay cells D1~Dn and increase or decrease the delay time therefrom, thereby compensating for the change in the delay time.

Another input signal TDC_RST is used to initialize the flipflop 115. There may be a change in the respective delay cells D1~Dn included in the signal conversion unit 110 according to the PVT (process, voltage, and temperature) conditions. Thus, the signal processing unit 120 detects a change in the delay time of each of the delay cells D1~Dn by using the output signals TDC_OUT<n:1> and AUX from the signal conversion unit 110, and when it is determined that a delay time is required to be corrected, the signal processing unit 120 initializes the flipflop 115 by activating the input signal TDC_RST. Thereafter, the signal processing unit 120 controls the signal Comp_sel input to the signal selection unit 130 to allow the signal selection unit 130 to transfer the second input signal pair TDC_Comp_INA and TDC_Comp_INB to the signal conversion unit 110, thereby correcting a change in the delay time of each of the delay cells D1~Dn included in the signal conversion unit 110.

Figure 3:
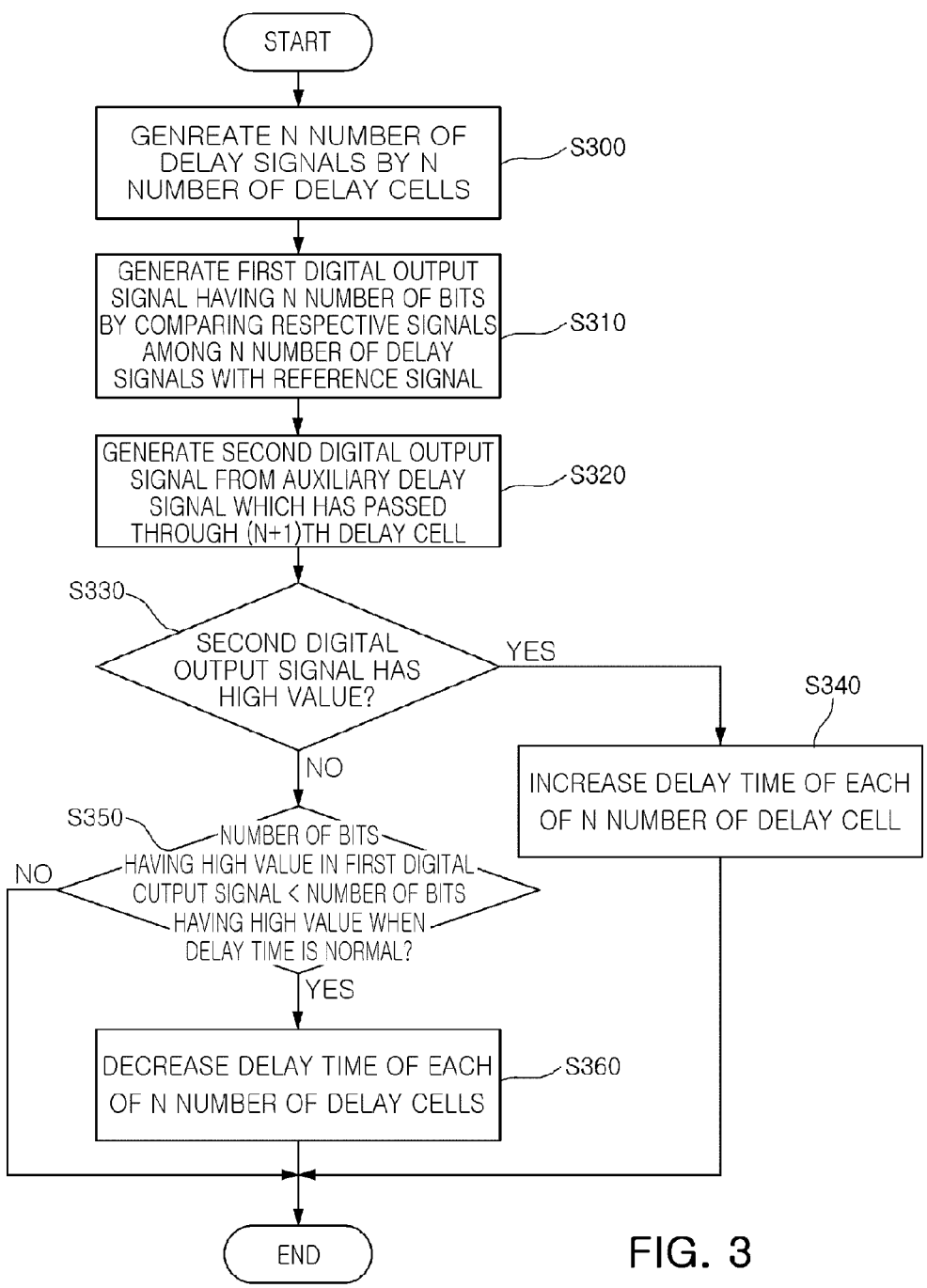
FIG. 3 is a flow chart illustrating a process of an analog-to-digital signal conversion method according to an embodiment of the present invention.

FIG. 3 is a flow chart illustrating a process of an analog-to-digital signal conversion method according to an embodiment of the present invention.

Referring to FIG. 3, the analog-to-digital signal conversion method according to an embodiment of the present invention starts with generating N number of delay signals by the N number of delay cells D1~Dn (S300). The N number of delay signals may be generated by delaying the signal Comp_INA input to the first delay cell D1 among the N number of delay cells D1~Dn connected to each other in series, by the delay time Tres of the respective delay cells D1~Dn. The signal conversion unit 110 may compare each of the N number of delay signals with a predetermined reference signal Comp_INB to generate the first digital output signal TDC_OUT<n:1> having N number of bits (S310).

Meanwhile, the signal conversion unit 110 may generate the second digital output signal AUX by using an auxiliary delay signal output from the auxiliary delay cell D_AUX connected to the output terminal of the final delay cell Dn among the N number of delay cells D1~Dn (S320). Here, when a delay time of the auxiliary delay cell D_AUX is equal to that of each of the N number of delay cells D1~Dn, the second digital output signal AUX may be considered to be a signal obtained by delaying the input signal Comp_INA by (N+1)*the delay time Tres. This will be described with reference to FIG. 4, hereinafter.

Figure 4:
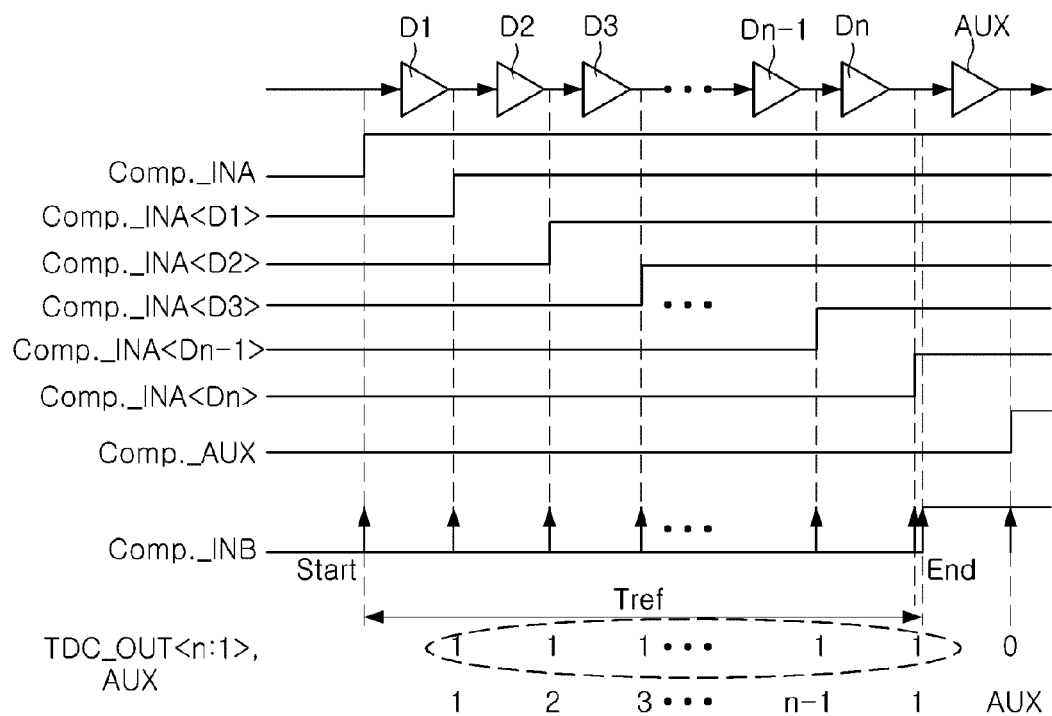
FIGS. 4 to 6 are timing diagrams illustrating the analog-to-digital signal conversion method according to an embodiment of the present invention.

FIG. 4 is a timing diagram illustrating the analog-to-digital signal conversion method according to an embodiment of the present invention. Referring to FIG. 4, the input signal Comp_INA is a digital signal in which a value thereof rises to a high value from a low value at a particular timing (Start), and when the input signal Comp_INA is input to the first delay cell D1 among the N number of delay cells D1~Dn connected to each other in series, N number of delay signals Comp_INA<D1>~Comp_INA<Dn> are generated. Also, the auxiliary delay cell D_AUX is connected to the output terminal of the Nth delay cell Dn, and the auxiliary delay cell D_AUX may generate the auxiliary delay signal Comp_AUX.

FIG. 4 illustrates an ideal case in which the respective delay cells D1~Dn have the same delay time Tres and the delay time Tres is not changed by the PVT conditions. A delay time Tref of the reference signal Comp_INB is set to be greater than N*Tres and smaller than N*Tres+T_AUX. Here, T_AUX refers to a delay time of the auxiliary delay cell D_AUX.

Thus, the output signals Comp_INA<D1> to Comp_INA<Dn> of the respective delay cells D1~Dn may have values greater than that of the reference signal Comp_INB at rising timings of the respective signals. As a result, the first digital output signal TDC_OUT<n:1> in which a corresponding nth bit has a high value when the output signals Comp_INA<D1> to Comp_INA<Dn> of the respective delay cells D1~Dn have rising timings earlier than that of the reference signal Comp_INB, has N number of values of "1".

Meanwhile, as illustrated in FIG. 4, the output signal Comp_AUX of the auxiliary delay cell D_AUX has a rising timing later than that of the reference signal Comp_INB, so that the second digital output signal AUX has a value of "0", a low value. As a result, the signal processing unit 120 may determine whether or not a delay time of each of the delay cells D1~Dn has changed according to whether or not the second digital output signal AUX has a high value (S330). In operation 5330, when the second digital output signal AUX has a high value, the signal processing unit 120 determines that the delay time Tres of each of the N number of delay cells D1~Dn has decreased, and artificially increases the delay times of the respective delay cells D1~Dn. This will be described with reference to FIG. 6, hereinafter.

Figure 6:
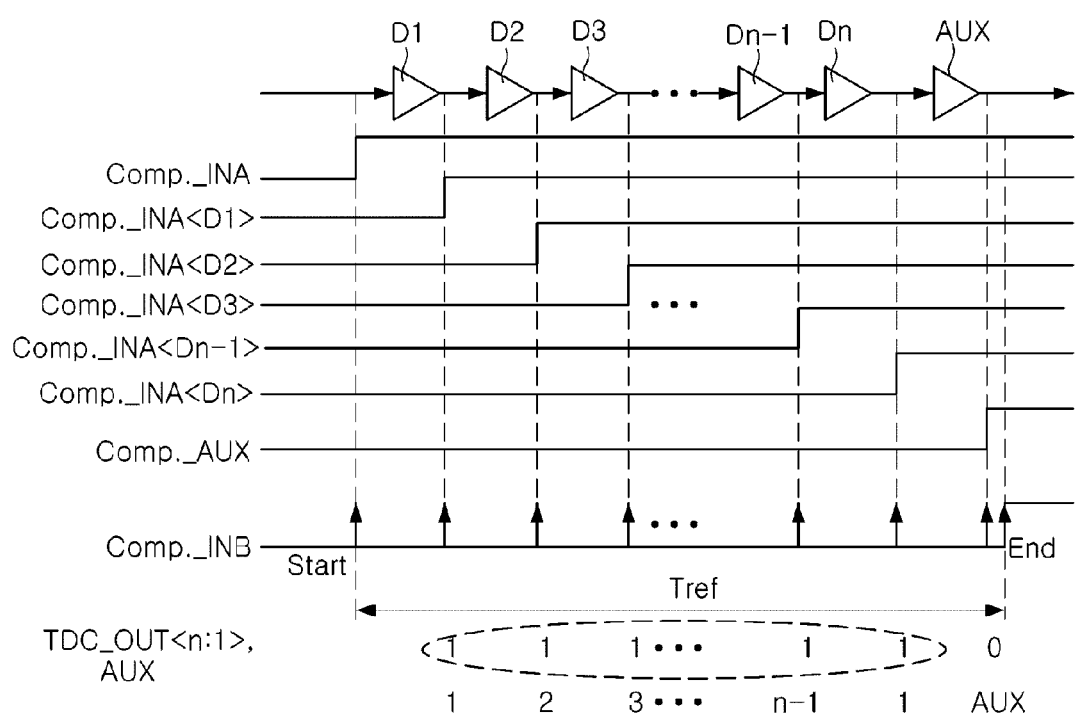

FIG. 6 illustrates a case in which the delay time Tres of each of the delay cells D1~Dn according to the PVT conditions or the like is shorter than that of a normal case. When it is assumed that the same reference signal Comp_INB is applied, all of the N number of delay signals Comp_INA<D1> to Comp_INA<Dn> respectively output from the N number of delay cells D1~Dn have rising timings earlier than that of the reference signal Comp_INB. Thus, all of the N number of bits included in the first digital output signal TDC_OUT<n:1> have a value of "1", a high value.

However, unlike the case of FIG. 4, the delay time Tres of each of the delay cells D1~Dn is shorter than that of the normal case, so that the auxiliary delay signal Comp_AUX output from the auxiliary delay cell D_AUX may have a rising timing earlier than that of the reference signal Comp_INB. Thus, unlike the case of FIG. 4, the second digital output signal AUX has a value of "1" corresponding to a high value. As a result, in operation S330, when the second digital output signal AUX has a high value, the signal processing unit 120 may determine that the delay time Tres of each of the N number of delay cells D1~Dn is shorter than that of an ideal case.

Here, the signal processing unit 120 may increase the delay time Tres of each of the delay cells D1~Dn by increasing a capacitance value of a capacitor bank included in each of the delay cells D1~Dn. This will be described with reference to FIGS. 7 and 8 later.

Meanwhile, in operation S330, when it is determined that the second digital output signal AUX has a low value, the signal processing unit 120 determines whether or not the delay time Tres of each of the delay cells D1~Dn is normal or has increased. Whether or not the delay time Tres has increased may be determined by comparing the number of bits having a high value in the first digital output signal TDC_OUT<n:1> and the number of bits having a high value in the first digital output signal TDC_OUT<n:1> when the delay time Tres is normal (S350).

According to the determination result in operation S350, when the number of bits having a high value in the first digital output signal TDC_OUT<n:1> is not smaller than the number of bits having a high value in the first digital output signal TDC_OUT<n:1> when the delay time Tres is normal, the signal processing unit 120 may determine that the delay time Tres is normal. Thus, the signal processing unit 120 may control the signal selection unit 130 such that the output signals TDC_INA and TDC_INB from the digital PLL circuit are input to the signal conversion unit 110, without performing a separate operation of compensating for the delay time Tres.

Meanwhile, when the number of bits having a high value in the first digital output signal TDC_OUT<n:1> is smaller than the number of bits having a high value in the first digital output signal TDC_OUT<n:1> when the delay time Tres is normal, the signal processing unit 120 may determine that the delay time Tres of each of delay cells D1~Dn has increased in comparison to the normal case. This will be described with reference to FIG. 5, hereinafter.

Figure 5:
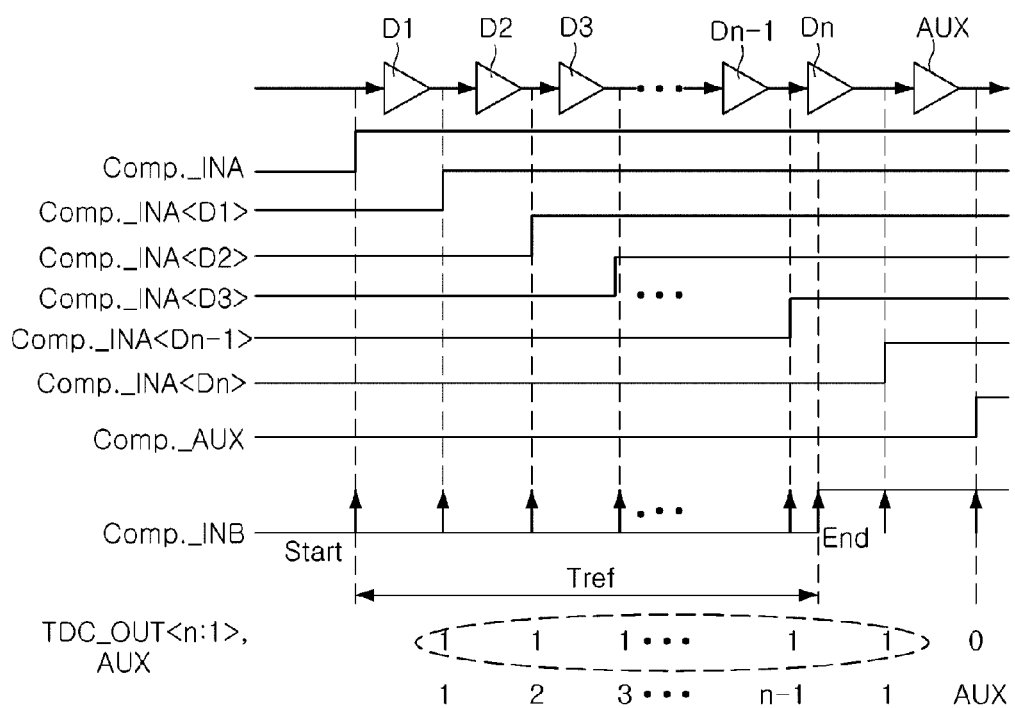

Referring to FIG. 5, a timing diagram in case that the delay time Tres of each of delay cells D1~Dn has increased in comparison to the normal case is illustrated. Thus, like the case of FIG. 4, since the output signal Comp_AUX from the auxiliary delay cell D_AUX has a rising timing later than that of the reference signal Comp_INB, the second digital output signal AUX has a low value. Meanwhile, due to the increase in the delay time Tres, there is a change in the output of the first digital output signal TDC_OUT<n:1>.

As the delay time Tres of each of the delay cells D1~Dn is increased, an output signal of at least one of the delay cells D1~Dn (i.e., an output signal of the delay cell Dn in FIG. 5) has a rising timing later than that of the reference signal Comp_INB. Thus, unlike the case of FIG. 4 in which all bits of the first digital output signal TDC_OUT<n:1> respectively have a high value, all bits of the first digital output signal TDC_OUT<n:1> respectively have a low value in FIG. 5.

Thus, when the number of bits having a high value in the first digital output signal TDC_OUT<n:1> is smaller than the number of bits having a high value in the first digital output signal TDC_OUT<n:1> when the delay time Tres is normal, the signal processing unit 120 may determine that the delay time Tres of each of the delay cells D1~Dn has increased in comparison to the normal case. In this case, the signal processing unit 120 may decrease the delay time Tres by reducing a capacitance value of the capacitor bank included in each of the delay cells D1~Dn (S360).

Figure 7:
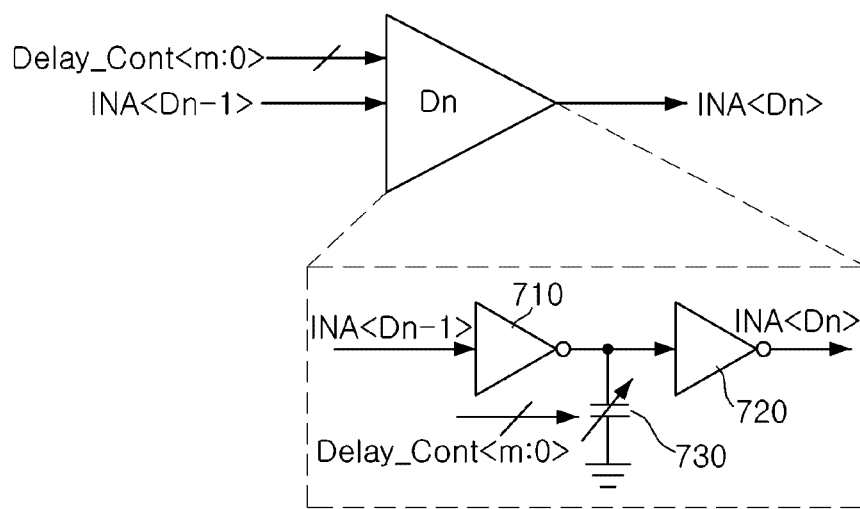
FIGS. 7 and 8 are detailed views of a delay cell of the signal conversion unit illustrated in FIG. 2.
Figure 8:
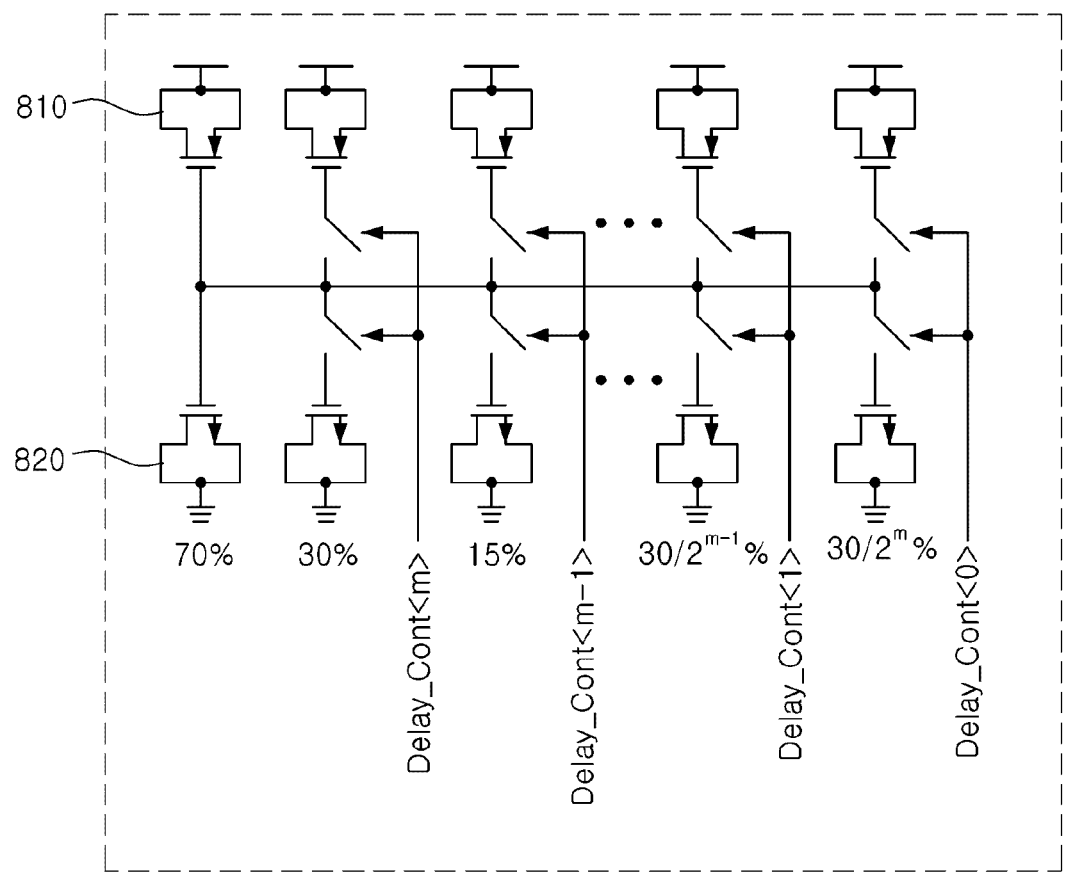

FIGS. 7 and 8 are detailed views of a delay cell of the signal conversion unit illustrated in FIG. 2.

FIG. 7 is an exploded view illustrating one delay cell Dn of the delay cells included in the signal conversion unit 120. The delay cell Dn may receive a delay signal INA<Dn−1> output from another delay cell Dn−1 connected in series and generate an output signal INA<Dn>. The delay time Tres of the delay cell Dn is controlled by the control signal Delay_Cont<m:0>. The delay cell Dn may include two inverters 710 and 720. A capacitor bank 730 may be connected between the respective inverters 710 and 720. The capacitor bank 730 may include a plurality of MOS capacitors. A capacitance value of the capacitor bank 730 is adjusted by the control signal Delay_Cont<m:0>. This will be described with reference to FIG. 8, hereinafter.

Referring to FIG. 8, the capacitor bank 730 includes a plurality of MOS capacitors 810 and 820. When an output value of the capacitor bank 730 for implementing the delay time Tres in an ideal case is defined as C, the MOS capacitors 810 and 820 connected to each other without a switch have a capacitance value corresponding to 70% of the output value C of the capacitor bank 730. Subsequently, values corresponding to 30%, 15%, . . . , $30/2^m$% of the output value C of the capacitor bank 730 are sequentially implemented by the MOS capacitors 810 and 820. Namely, in the embodiment of FIG. 8, the capacitor bank 730 includes a total of (m+2) number of pairs of MOS capacitors 810 and 820. Meanwhile, FIG. 8 illustrates that the pair of MOS capacitors 810 and 820 having a value corresponding to 30% of the output value C of the capacitor bank 730 are controlled by a most significant bit (MSB) value of the control signal Delay_Cont<m:0>, and the pair of MOS capacitors 810 and 820 having a value corresponding to the smallest value, $30/2^m$% of the output value C of the capacitor bank 730 are controlled by a least significant bit (LSB) value, but this is merely an embodiment of the present invention and a different embodiment thereof may also be implemented.

In FIG. 8, when all of the switches are turned on, the capacitor bank 730 may have a value corresponding to 1.3C. Meanwhile, when all the switches are turned off, the capacitor bank 730 has a value corresponding to 0.7C. Thus, the capacitance value of the capacitor bank 730 may be adjusted within a range between 70% and 130% by adjusting the value of the control signal Delay_Cont<m:0>, and as a result, the delay time Tres may be adjusted within the range of ±30%. Here, the adjustment range of ±30% is merely an embodiment and the delay time Tres may be implemented by a different value.

Figure 9:
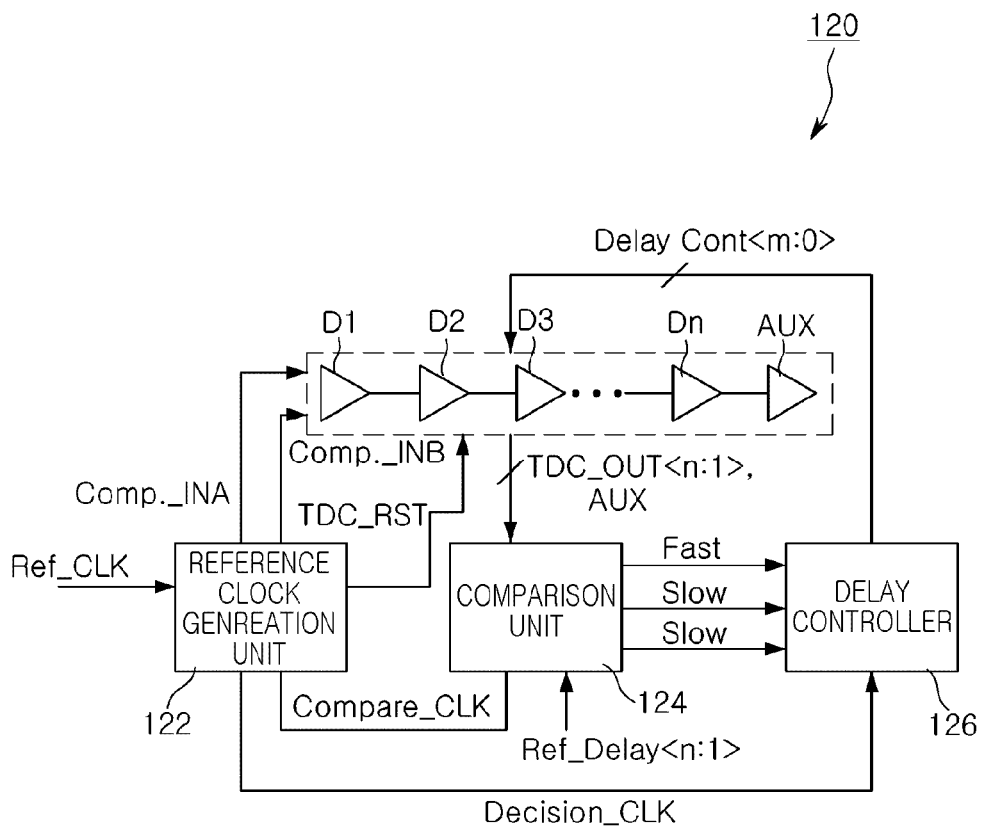
FIG. 9 is a detailed view of a signal processing unit of the analog-to-digital signal conversion apparatus illustrated in FIG. 1.

FIG. 9 is a detailed view of a signal processing unit of the analog-to-digital signal conversion apparatus illustrated in FIG. 1.

Referring to FIG. 9, the signal processing unit 120 may include a reference clock generation unit 122, a comparison unit 124, a delay controller 126, and the like. The reference clock generation unit 122 may receive the reference clock signal Ref_CLK, and generate the reference signal Comp_INB which is compared with the N number of digital delay signals generated by the N number of delay cells D1~Dn, the signal TDC_RST as a reset signal, and a comparison clock signal Compare_CLK, or the like. The reference clock signal Ref_CLK may be generated from a correction oscillator, or the like.

The comparison unit 124 determines whether or not the delay time Tres has changed by using the comparison clock signal Compare_CLK, the input signal Ref_Delay<n:1>, and the first and second digital output signals TDC_OUT<n:1> and AUX of the signal conversion unit 110. As described above, when the second digital output signal AUX has a high value, it may be determined that the delay time Tres has decreased. Also, when the second digital output signal AUX has a low value and when it is determined that the number of bits having a high value in the first digital output signal TDC_OUT<n:1> has changed, it may be determined that the delay time Tres has increased.

The delay controller 125 generates a control signal Delay_Cont<m: 0> with respect to the capacitor bank 730 based on the result of change in the delay time Tres determined by the comparison unit 124. When it is determined that the delay time Tres has decreased, the delay controller 125 may generate a control signal Delay_Cont<m:0> to increase a capacitance value output by the capacitor bank 730 in order to increase the delay time Tres. Conversely, when it is determined that the delay time Tres has increased, the delay controller 125 may generate the control signal Delay_Cont<m: 0> to reduce the capacitance value output by the capacitor bank 730 in order to decrease the delay time Tres.

As set forth above, according to embodiments of the invention, a change in a delay time of each delay cell can be determined by using the first digital output signal having N number of bits generated by each of N number of delay cells connected to each other in series, the second digital output signal generated by the auxiliary delay cell additionally connected to the N number of delay cells, and a predetermined reference signal. Thus, a change in the delay time generated due to PVT conditions, or the like, can be accurately determined and compensated, and operational stability of the analog-to-digital signal conversion apparatus and the digital PLL circuit including the same can be enhanced.

While the present invention has been shown and described in connection with the embodiments, it will be apparent to those skilled in the art that modifications and variations can be made without departing from the spirit and scope of the invention as defined by the appended claims.

What is claimed is:

1. An analog-to-digital signal conversion method comprising:
    generating a first digital output signal having N number of bits by comparing each of N number of delay signals detected from output terminals of N number of delay cells with a reference signal;
    generating a second digital output signal by comparing an auxiliary delay signal generated by an (N+1)th delay cell with the reference signal; and
    determining a change in a delay time of each of the N number of delay cells based on the first digital output signal and the second digital output signal.

2. The analog-to-digital signal conversion method of claim 1, wherein in the determining, when the second digital output signal has a high value, it is determined that the delay time of each of the N number of delay cells has decreased.

3. The analog-to-digital signal conversion method of claim 1, wherein in the determining, when the second digital output signal has a low value, it is determined that the delay time of each of the N number of delay cells has increased or is normal.

4. The analog-to-digital signal conversion method of claim 3, wherein in the determining, when the number of bits having a value of "1" among the N number of bits in the first digital output signal is smaller than the number of bits having a high value in the first digital output signal when the delay time of each of the N number of delay cells is normal, it is determined that the delay time of each of the N number of delay cells has increased.

5. The analog-to-digital signal conversion method of claim 1, further comprising correcting the delay time of each of the N number of delay cells, when it is determined that the delay time of each of the N number of delay cells has changed in the determining of a change in a delay time.

6. The analog-to-digital signal conversion method of claim 5, wherein in the correcting, when it is determined that the delay time of each of the N number of delay cells has increased, a capacitance value of a capacitor bank included in each of the N number of delay cells is reduced.

7. The analog-to-digital signal conversion method of claim 5, wherein in the correcting, when it is determined that the delay time of each of the N number of delay cells has decreased, a capacitance value of a capacitor bank included in each of the N number of delay cells is increased.

8. An analog-to-digital signal conversion apparatus comprising:
    a signal conversion unit including N number of delay cells connected to each other in series and generating N number of delay signals from a predetermined input signal and an auxiliary delay cell connected in series to an Nth delay cell among the N number of delay cells; and
    a signal processing unit generating a first digital output signal having N number of bits by comparing each of the N number of delay signals with a reference signal, and generating a second digital output signal by comparing an auxiliary delay signal output by the auxiliary delay cell with the reference signal,
    wherein the signal processing unit determines a change in a delay time of each of the N number of delay cells based on the first digital output signal and the second digital output signal.

9. The analog-to-digital signal conversion apparatus of claim 8, wherein each of the N number of delay cells includes a capacitor bank having a variable capacitance value determined by a digital control signal having M number of bits.

10. The analog-to-digital signal conversion apparatus of claim 9, wherein when it is determined that the delay time of each of the N number of delay cells is outside of a normal range, the signal processing unit adjusts the delay time of each of the N number of delay cells by adjusting the variable capacitance value of the capacitor bank.

11. The analog-to-digital signal conversion apparatus of claim 10, wherein when it is determined that the delay time of each of the N number of delay cells is greater than an upper limit value of the normal range, the signal processing unit reduces the variable capacitance value of the capacitor bank.

12. The analog-to-digital signal conversion apparatus of claim 10, wherein when it is determined that the delay time of each of the N number of delay cells is smaller than a lower limit value of the normal range, the signal processing unit increases the variable capacitance value of the capacitor bank.

13. The analog-to-digital signal conversion apparatus of claim 9, wherein the capacitor bank includes:
   a fixed capacitor having a fixed capacitance value smaller than a maximum value of the variable capacitance value; and
   M number of capacitor units selectively controlled by a value of each of the M number of bits included in the digital control signal.

14. The analog-to-digital signal conversion apparatus of claim 13, wherein a capacitor unit among the m number of capacitor units, controlled by a most significant bit (MSB) value among the M number of bits, has a capacitance value corresponding to 30% of a maximum value of the variable capacitance value, and
   a capacitor unit among the m number of capacitor units, controlled by a least significant bit (LSB) value among the M number of bits, has a capacitance value corresponding to $30/2^M$% of the maximum value of the variable capacitance value.

15. The analog-to-digital signal conversion apparatus of claim 8, wherein when the second digital output signal has a high value, the signal processing unit determines that the delay time of each of the N number of delay cells has decreased.

16. The analog-to-digital signal conversion apparatus of claim 8, wherein when the second digital output signal has a low value and the number of bits having a high value in the first digital output signal is smaller than the number of bits having a high value included in the first digital output signal when the delay time of each of the N number of delay cells is normal, the signal processing unit determines that the delay time of each of the N number of delay cells has increased.

17. The analog-to-digital signal conversion apparatus of claim 8, wherein the input signal includes a first input signal generated by the signal processing unit and used to determine the change in the delay time of each of the N number of delay cells and a second input signal transferred from the outside, and
   the reference signal includes a first reference signal generated by the signal processing unit and used to determine the change in the delay time of each of the N number of delay cells and a second reference signal transferred from the outside.

18. The analog-to-digital signal conversion apparatus of claim 17, further comprising a signal selection unit controlling the first input signal and the first reference signal to be input to the signal conversion unit when an input selection signal output by the signal processing unit has a first value, and controlling the second input signal and the second reference signal to be input to the signal conversion unit when the input selection signal has a second value different from the first value.

* * * * *